United States Patent [19]

Evans

[11] Patent Number: 4,568,913

[45] Date of Patent: * Feb. 4, 1986

[54] HIGH SPEED INTEGRATING ANALOG-TO-DIGITAL CONVERTER

[75] Inventor: Lee L. Evans, Atherton, Calif.

[73] Assignee: Intersil, Inc., Cupertino, Calif.

[*] Notice: The portion of the term of this patent subsequent to Jul. 26, 2000 has been disclaimed.

[21] Appl. No.: 443,600

[22] Filed: Nov. 22, 1982

Related U.S. Application Data

[63] Continuation of Ser. No. 134,153, Mar. 25, 1980, Pat. No. 4,395,701.

[51] Int. Cl.$^4$ ............................................. H03K 13/02
[52] U.S. Cl. ........................... 340/347 NT; 324/99 D; 340/347 CC; 340/347 M
[58] Field of Search .... 340/347 M, 347 NT, 347 AD, 340/347 CC; 324/99 D

[56] References Cited

U.S. PATENT DOCUMENTS

| | | | |
|---|---|---|---|
| 3,296,613 | 1/1967 | Andersen et al. | 340/347 |
| 3,577,140 | 5/1971 | Aasnaes | 340/347 NT |
| 3,646,586 | 2/1972 | Kurz | 340/347 AD |
| 4,161,724 | 7/1979 | Smutny | 324/99 D X |

OTHER PUBLICATIONS

The Engineering Staff of Analog Devices, Inc., Analog-Digital Conversion Handbook, 6/1972, pp. II-48 to II-51; II-111 to II-113.
Walton, Triple Ramp Analog-Digital-Converter . . . , vol. 11, No. 4, 9/1968, pp. 384-385.

Primary Examiner—T. J. Sloyan
Attorney, Agent, or Firm—Spensley Horn Jubas & Lubitz

[57] ABSTRACT

An integrating type analog-to-digital converter with improved time measurement capabilities and a very fast conversion cycle. The converter operates by integrating an analog input signal for a predetermined time period and then deintegrating the integrated signal until its output crosses zero. The time it takes for the integrator to cross zero is measured by a digital clock, and the zero crossing is detected as occurring on the first clock pulse after the integrator output has actually crossed zero. The residual output of the integrator at the point of detection is multiplied by a predetermined negative amount and fed back so that the integrator output assumes the multiplied value of the residual. The integrator is then deintegrated for a second time and the time it takes for the integrator output to pass zero is again measured by the clock. The measured time is proportional to the error in the measurement between the detected zero crossing and actual zero crossing in the initial deintegration cycle. By subtracting a predetermined fraction of the second deintegration time from the first deintegration time, a more accurate measure of the actual time it takes the integrator output to cross zero is obtained. By utilizing a plurality of subsequent multiplication and deintegration cycles, the resolution of the actual deintegration time measurement may be further increased. Using this technique, a 12 bit measurement can be made with less than 200 clock pulses as a opposed to 8,192 ($2^{13}$) in prior art converters.

2 Claims, 8 Drawing Figures

| SWITCH | ① AUTO-ZERO | ② INTEGRATE | ③ DEINTEGRATE | ④ SAMPLE & HOLD | ⑤ TIMES 8 FEEDBACK |
|---|---|---|---|---|---|
| 62 | CLOSED | OPEN * | OPEN | OPEN | OPEN |
| 64 | OPEN | OPEN | OPEN | CLOSED * | CLOSED |
| 66 | CLOSED | CLOSED | CLOSED | OPEN * | OPEN |
| 68 | CLOSED | CLOSED | CLOSED | CLOSED * | OPEN * |
| 70 | OPEN | OPEN | OPEN | OPEN | CLOSED |
| 72 | CLOSED | OPEN * | OPEN | OPEN | OPEN |
| 74 | OPEN | OPEN (Vin) | OPEN (CONNECT Vref) | OPEN | CLOSED * |

| SWITCH | ⑥ DEINTEGRATE | ⑦ SAMPLE & HOLD | ⑧ TIMES 8 FEEDBACK | ⑨ DEINTEGRATE | ⑩ ZERO CROSSING AUTO-ZERO |
|---|---|---|---|---|---|
| 62 | OPEN | OPEN | OPEN | OPEN | CLOSED * |
| 64 | OPEN * | CLOSED * | CLOSED | OPEN * | OPEN |
| 66 | CLOSED * | OPEN * | OPEN | CLOSED ** | CLOSED |
| 68 | CLOSED * | CLOSED * | OPEN * | CLOSED * | CLOSED |
| 70 | OPEN * | OPEN | CLOSED | OPEN | OPEN |
| 72 | CLOSED | OPEN | OPEN | OPEN | CLOSED * |
| 74 | OPEN * | OPEN | CLOSED * | OPEN | OPEN |

\* DENOTES CHANGED CONDITION OF SWITCH

FIG. 7.

HIGH SPEED INTEGRATING ANALOG-TO-DIGITAL CONVERTER

This is a continuation of application Ser. No. 134,153 filed on Mar. 25, 1980, now U.S. Pat. No. 4,395,701.

BACKGROUND OF THE INVENTION

1. Field of the Invention

This invention relates to analog-to-digital converters. More specifically, this invention relates to integrating type analog-to-digital converters, and in particular, dual slope integrating converters.

2. Description of the Prior Art

An analog-to-digital (A/D) converter provides a digital output which indicates the magnitude of an unknown analog input signal. The output may be a decimal number such as "4.25" or a binary number such as "10.01" which signifies some multiplier times a standard unit such as the "volt".

Heretofore, two types of analog-to-digital converters have been used, each having particular advantages and disadvantages. The two types are referred to as successive approximation type and integrating type converters. A successive approximation analog-to-digital converter employs a digital-to-analog converter (DAC) in a feedback loop with a comparator and a logic circuit referred to as a "successive approximation register." In the standard system, a binary sequence is employed. Initially, the most significant binary bit (MSB) is set to one, and all lower bits are set to zero. The DAC then produces an analog voltage corresponding to the value of that most significant bit. For example, in a ten-bit system, the DAC initially might produce a voltage of $2^9 = 512$ volts. If this voltage is less than the analog input, the MSB is left at one. If the DAC output is greater than the input, the bit is set to zero.

The successive approximation register then moves on to the next bit of lower significance. This bit is set to one, and the resultant DAC output again is compared to the unknown analog input. If the DAC output is less than the input, this bit is left at one; if not, the bit is set to zero. The process is repeated successively for all bits. At the completion of the conversion, those bits left in the one state produce an output voltage from the DAC which would match the analog input to within $+$ or $-\frac{1}{2}$ of the least significant bit. Performing an "n" bit conversion requires only "n" trials, making the technique capable of high speed conversion.

In the conventional successive approximation converter employing a binary sequence, the digital-to-analog converter uses an impedance network in which the elements correspond to values of the binary sequence. For example, the DAC may employ a set of resistors which are selected to produce voltages or currents having values of 512, 256, 128, 64, 32, 16, 8, 4, 2 and 1. While successive approximation analog-to-digital converters are very fast, they are also complex and it is difficult to achieve 12 bit accuracy with present chip technology. The resistors in the impedance network invariably have to be trimmed by laser trimming or otherwise to achieve the desired accuracy. Even then, a significant percentage of the resistors do not meet the accuracy requirements.

Figure 2:
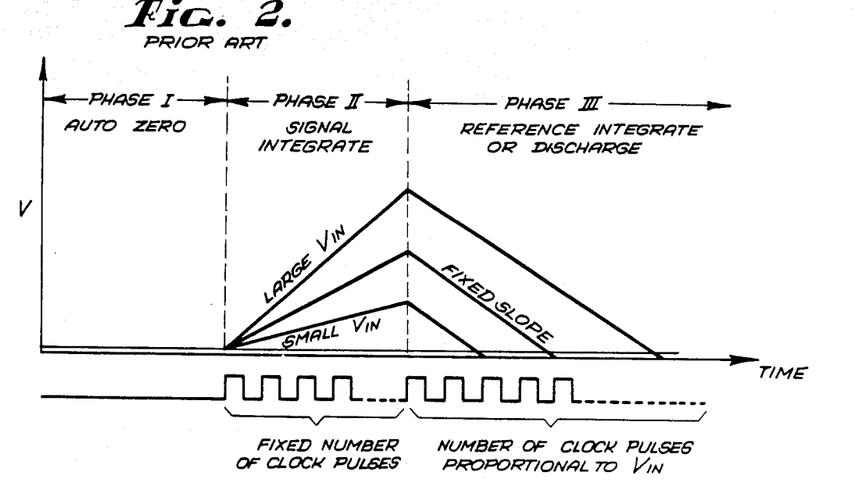
FIG. 2 is a graph showing the three operational phases of a prior art converter.

Compared to a successive approximation converter, the integrating type analog-to-digital converter is simple, low cost, very linear and slow. Generally, its speed is limited to approximately 100 readings per second to achieve 12 bit accuracy as opposed to 50,000 readings per second for a typical IC successive approximation converter. In a dual slope integrating analog-to-digital converter, an analog input signal is integrated for a fixed period of time. The integrator is then discharged at a known rate until its output crosses zero, with zero crossing being detected with a comparator. This is shown in FIG. 2 of the drawings. The first phase is an "auto-zero" phase, which corrects for offset voltages of the analog components of the converter. The ratio of the integrating time (phase II) to the discharge time (phase III), which can be measured digitally (i.e., by counting clock pulses), is proportional to the value of the analog input signal.

The major drawback of the dual slope integrating analog-to-digital converter is its relatively slow speed. This slow speed has been necessitated by the need to obtain high accuracy discharge time measurements, i.e., to accurately measure the zero-crossing of the integrator. Since clock pulses are counted to determine the discharge time, one or more clock pulses is required for each quantum of measurement. For example, a 12 bit converter requires at least $2^{12}$ or 4096 clock pulses of deintegration per measurement if the least significant bit is to be accurate. Additional time (approximately another 4096 pulses) is required for the auto-zero and integrate phases.

Since the minimum number of clock pulses per measurement in prior art converters is controlled by the quantum of measurement, it is apparent that the speed of a measurement cycle can only be increased by using a fast, i.e., high frequency clock. However, the use of a fast clock is limited by the delay of the comparator in detecting zero crossing. In order to obtain an accurate count of the deintegrate time, the comparator delay should be no more than one-half clock pulse. The comparator used in one typical prior art converter has a 3 $\mu$s delay in detecting zero crossing. Using the one-half clock pulse delay criterion, the clock frequency with this converter is limited to 160,000 KHz or approximately 20 readings per second for a 12 bit converter.

It is a primary object of the present invention to provide an integrating analog-to-digital converter which achieves high accuracy while at the same time being very fast, i.e., having a very short measurement cycle.

It is another object of the present invention to overcome the comparator delay and fast clock requirement limitations of prior art converters.

It is a further object to provide a converter which requires less than 200 clock pulses for a 12 bit conversion as opposed to more than 8,000 required in prior art converters.

It is yet another object of the present invention to provide a converter which does not require at least one clock pulse of deintegration per quantum of measurement.

SUMMARY OF THE INVENTION

The present invention achieves this object by providing a way to measure the discharging time of the integrator with a degree of accuracy that is greater than the pulse width of the measuring clock. The converter operates by initially performing a conventional dual slope integration, i.e., an analog input signal is integrated and then the integrator is discharged until its output crosses zero and a new clock pulse begins. At this point, the integrator discharge is stopped. This dual slope integration is performed within a very short time period, e.g., 128 counts, compared with typical prior art measuring cycles of 8,192 counts for a 12 bit resolution. The difference between the actual zero crossing point and the detected zero crossing point (the first clock pulse after zero crossing) represents an error in the discharging time. In order to obtain a more accurate measurement of the discharging time, the residual output of the integrator, i.e., the amount that the integrator has passed zero, at the detected zero crossing point is multiplied by a predetermined value and fed back to the integrator so that the integrator output assumes the multiplied value. The integrator is then again discharged until a new zero crossing point is detected. The time it takes for the integrator to discharge is proportional to the error in the initial time measurement. Therefore, by appropriately weighting the second discharging time and subtracting it from the first discharging time, a more accurate measurement of the actual discharge time can be obtained.

The second discharge time measurement may also have an error due to the fact that the actual zero crossing may not coincide with the detected zero crossing. Since the detected discharge time is actually greater than the actual discharge time, the result is that too much time was subtracted from the first measurement. The accuracy of the measurement may be further increased by again multiplying the residual output of the integrator and feeding it back so as to cause the integrator output to achieve a new value corresponding to a predetermined multiple of the residual output of the integrator after the second deintegrate cycle. The integrator is then discharged for a third time and this time period, appropriately weighted, is added to the measurement previously obtained. It can be seen that the accuracy of the measurement can be increased by alternately subtracting and adding the discharging times of the multiplied residuals which are fed back to the integrator output.

The present invention accomplishes the above function by modifying the conventional dual slope analog-to-digital converter so as to include the appropriate amplification and feedback circuitry. The converter also includes switches controlled by a logic control circuit which are utilized to control the different parts of a measurement cycle. The invention thus provides a high speed integrating analog-to-digital converter which has a high degree of accuracy.

DESCRIPTION OF THE PREFERRED EMBODIMENT

Figure 1:
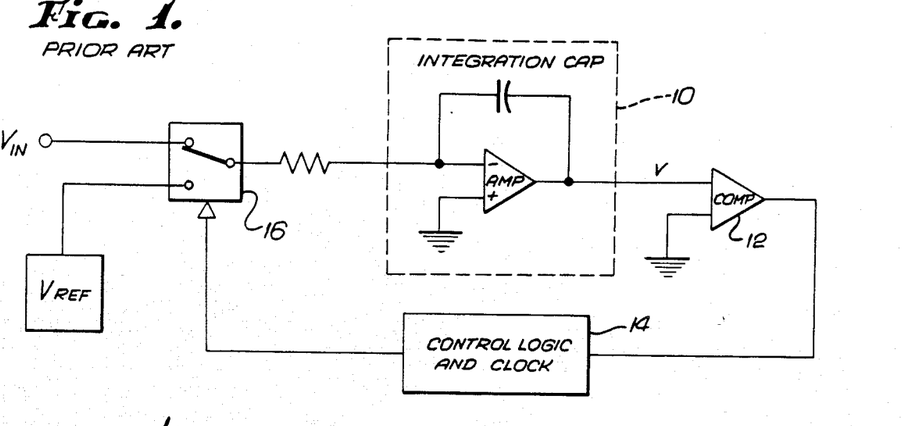
FIG. 1 is a block diagram of a simplified prior art dual slope integrating analog-to-digital converter.

Referring to FIG. 1, a simplified diagram of a prior art dual slope analog-to-digital converter is shown. The converter includes an integrator 10 whose output is fed to a comparator 12. The output of the comparator 12 is connected to a control logic and clock 14 which counts clock pulses and controls a switch 16. The switch 16 can be switched between an input voltage $V_{in}$ and a reference voltage $V_{ref}$.

FIG. 2 shows a diagram of the three phases of a dual slope conversion of the analog-to-digital converter of FIG. 1. In phase I, labeled "auto zero", errors in analog components of the analog-to-digital converter will be automatically nulled out by storing error information on an "auto-zero" capacitor (not shown in FIG. 1). During phase II, labled "signal integrate", the input signal is integrated by the integrator 10 for a fixed number of clock pulses. For a 3½ digit converter, 1,000 clock pulses using a 2 MHz clock is a typical count; for a 4½ digit converter, 10,000 pulses is typical. On completion of the integration, the output voltage V of the integrator is directly proportional to the input signal.

The third phase is labeled "reference integrate", and may also be referred to as deintegrate or integrator discharge. During this phase, the input of the integrator 10 is switched from $V_{in}$ to $V_{ref}$. The polarity of $V_{ref}$ is determined during phase II such that the integrator 10 discharges back towards zero. The ratio between the fixed number of clock pulses of phase II and the number of clock pulses counted during phase III between the beginning of the cycle and the time when the integrator output passes through zero is a digital measure of the magnitude of $V_{in}$.

Figure 3:
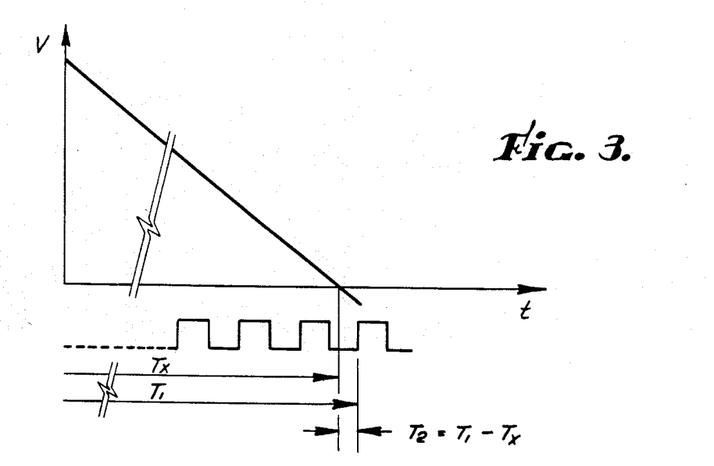
FIG. 3 is an expanded view of the third phase of tne diagram of FIG. 2.

Referring now to FIG. 3, it can be seen that the output of the integrator 10 actually crosses zero at time $T_x$. However, the zero crossing will be detected as ocurring at time $T_1$ corresponding to the occurrence of the first clock pulse after $T_x$. Therefore, the detected discharge time has an error of $T_2 = T_1 - T_x$ with respect to the actual discharge time. In order to minimize the effect on the analog-to-digital conversion caused by this error, the measurement cycle of the dual slope conversion is kept relatively large. The present invention is designed to overcome this error while permitting a very short measurement cycle to be utilized.

Figure 4:
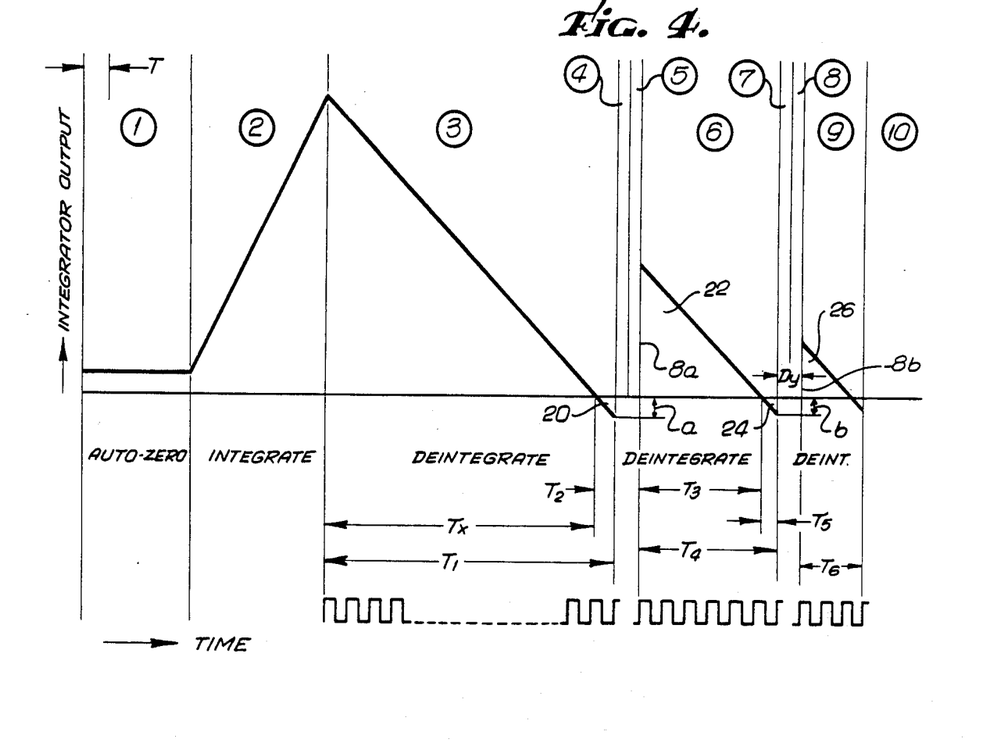
FIG. 4 is a diagram of the operational phases of the analog-to-digital converter of the present invention.
Figure 5:
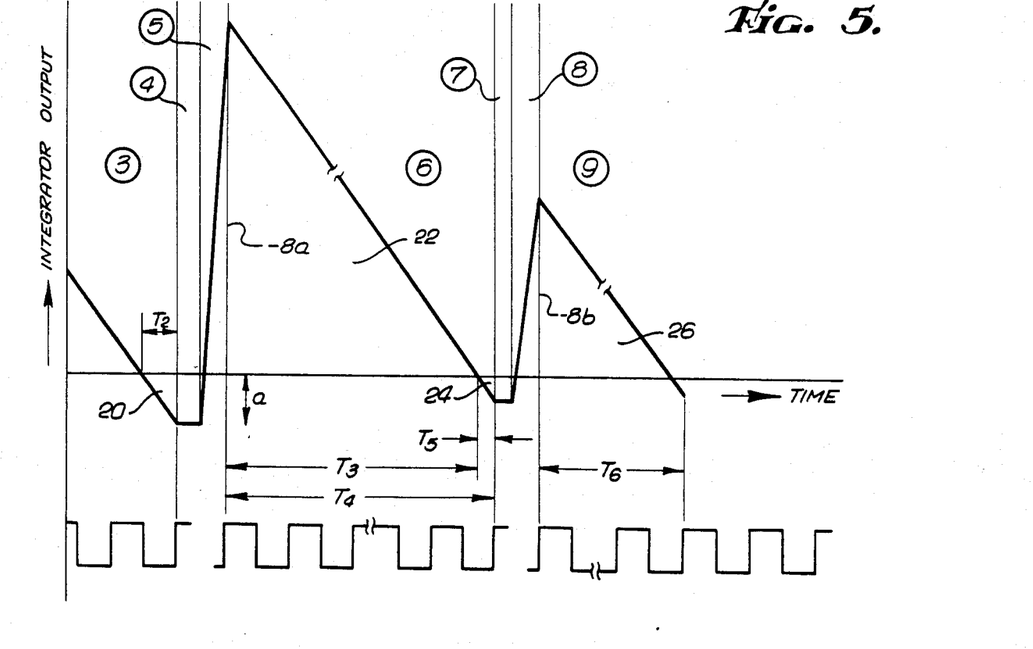
FIG. 5 is an expanded view of a portion of the diagram of FIG. 4.

Referring now to FIGS. 4 and 5, the operational theory of the present invention will be described. Initially, the three phases of a classical dual slope conversion are performed. This results in a discharge time which is measured as being $T_1$. Although the actual zero crossing of the integrator occurs at a time $T_x$, the zero crossing will not be detected until a time $T_1$ corresponding to the first clock pulse which occurs after $T_x$. This error in measurement is designated as $T_2$. In order to get a more accurate measurement of the time $T_x$, there needs to be some method of determining and subtracting the time $T_2$ from the time $T_1$. The present invention accomplishes this.

At time $T_1$, the voltage output of the integrator has passed zero by an amount a. This value may be multiplied by a predetermined number and fed back so that the integrator output assumes (after a circuit delay) a voltage equivalent to the multiplied value. During the circuit delay two functions are performed during fourth and fifth phases, as described hereinbelow. In the example shown in FIG. 4, the value a is multiplied by −8 so that the integrator output changes to $-8a$ volts. The integrator is then discharged a second time during a sixth phase. The measured discharge time for this second deintegration cycle is equal to $T_4$. The actual deintegration time is equal to $T_3$. The difference between $T_4$ and $T_3$ is $T_5$.

Because the discharge rate for the two deintegration cycles ($T_1$ and $T_3$) is the same, a triangle 20 (FIGS. 4, 5) having $a$ as one side is similar to a triangle 22 having $8a$ as the length of one side. Therefore, $$\frac{T_2}{a} = \frac{T_3}{8a}$$

and, $$T_2 = \frac{T_3}{8}$$

Since $T_3$ is approximately equal to the measured value $T_4$, $$T_2 \cong \frac{T_4}{8}$$

Thus, $$T_x \cong T_1 - \frac{T_4}{8}$$

Thus, it can be seen that although the time period $T_2$ cannot be measured directly with the converter clock, its value may be determined by measuring the value $T_4$ and dividing it by 8. This value may then be subtracted from the value $T_1$ to give a more accurate measure of the actual deintegration time $T_x$.

Since the value $T_4$ is greater than the actual value $T_3$ of the second deintegration phase, too much time will actually be subtracted from the value $T_1$. This may be overcome by again multiplying the residual output of the integrator (denoted by $b$) at the end of the second deintegrate phase and discharging the integrator for a third time. The multiplication is accomplished during phases seven and eight and the discharging accomplished during a ninth phase. The third discharge time is denoted as $T_6$. Due to the similarity of two triangles 24 and 26, $$\frac{T_5}{b} = \frac{T_6}{8b}$$

Therefore, $$T_5 = \frac{T_6}{8}$$

Since the value of $T_6$ can be measured, it may be added (after appropriate weighting) to the value $T_1 - (T_4/8)$ in order to obtain a more accurate value for the time $T_x$.

From the above discussion, it can be seen that a time measurement for $T_x$ which has a degree of precision that is greater than the pulse width of the clock may be obtained. By multiplying the residual output of the integrator after a deintegrate phase, feeding it back to the integrator and then deintegrating again, a time period may be measured which is approximately proportional to the error introduced in the preceding deintegrate phase. By alternately subtracting and adding weighted values of the suceeding deintegrate times from the originally measured deintegrate time, a more accurate measurement of the actual deintegration time is possible.

In the graphs shown in FIGS. 4 and 5, the determination of $T_x$ may be seen as follows. The times $T_1$, $T_4$ and $T_6$ are known and therefore $T_x$ must be expressed as a function of these times. Initially, $$T_x = T_1 - T_2$$

$$T_2 \cong \frac{T_3}{8}$$

$$T_3 = T_4 - T_5$$

$$T_5 \cong \frac{T_6}{8}$$

$$T_x = T_1 - \frac{T_3}{8}$$

$$T_3 \cong T_4 - \frac{T_6}{8}$$

$$T_x \cong T_1 - \frac{T_4 - \frac{T_6}{8}}{8}$$

$$T_x \cong T_1 - \frac{T_4}{8} + \frac{T_6}{64}$$

Therefore, $T_x$ can be expressed as function of the measured values $T_1$, $T_4$ and $T_6$.

Figure 6:
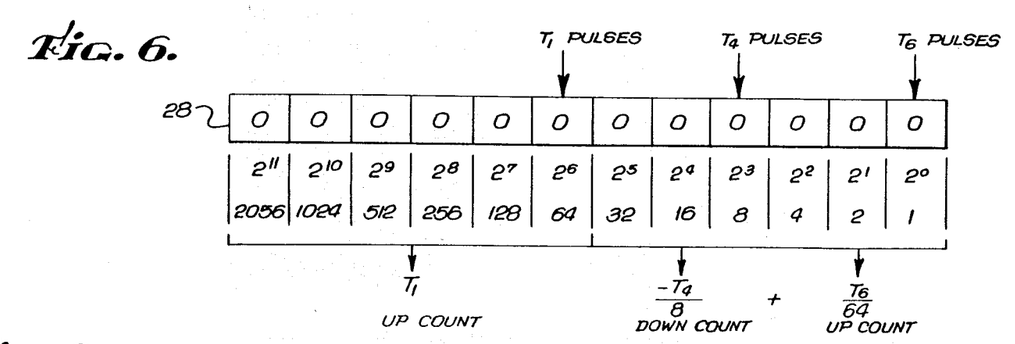
FIG. 6 shows a register which is used to store time measurements in the analog-to-digital converter.

In an electronic circuit, the one-eighth and one sixty-fourth weighting of the measured values of $T_4$ and $T_6$ is easily accomplished without actually having to divide the measured values. As shown in FIG. 6, if a 12 bit binary conversion is being done and the multiplication factor for the residual output of the integrator is eight, the counts representing $T_1$ are fed into the sixth most significant bit of a register 28, with the count being an up count. In order to divide the value $T_4$ by 8 with respect to $T_2$, count pulses occurring during the interval $T_4$ may be fed into the ninth most significant bit of the register 28, which has a value that is $\frac{1}{8}$ of bit 6, (i.e., it is three bits away in a binary system). Because the value $T_4/8$ must be subtracted from $T_1$, the count is a down count. Similarly, the value $T_6$ is fed into the twelfth most significant bit in order to weight it properly. Since its value is to be added, the count is an up count. Bit 12 has 1/64 of the value of of bit 6, and thus the proper weighting of $T_6$ will occur.

Although the above description is given with respect to a binary system, it should be appreciated that many other types of systems could be used and different multiplication factors could be used. For example, if a decimal system were used, instead of multiplying the residual output of the integrator by $-8$, it may be multiplied by $-10$. In general, the residual integrator output is multiplied by some power of the base of the number system used, e.g., $2^n$ for a binary system and $10^n$ for a decimal system. The various deintegrating times are thus appropriately weighted by feeding them into different bits of a timing pulse counter or results register. In addition, any number of deintegrating phases may be used. By increasing the number of times the deintegrate cycle is repeated, the time for each cycle can be reduced, thereby resulting in a faster overall conversion.

For example, in the system described above using three deintegrate cycles, the maximum time used for each of the deintegrations may be 64 counts. In a system using four deintegrate cycles, however, the maximum time used for each deintegration may be 8 counts.

Figure 7:
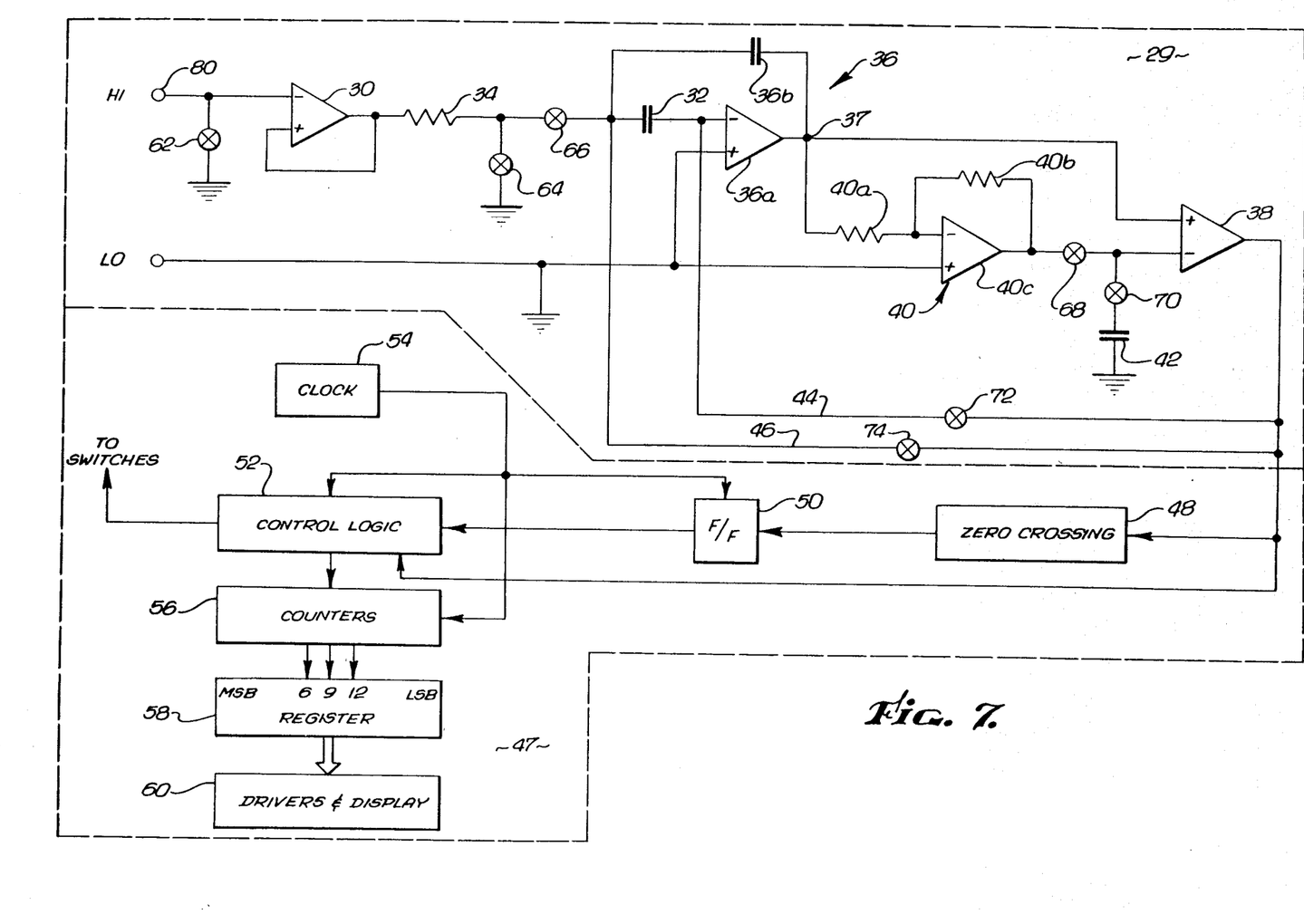
FIG. 7 is a circuit diagram of the present invention.

Referring now to FIG. 7, the circuit which is used to achieve the successive deintegrations will be described. The analog portion of the circuit is designated by number 29 and the digital portion of the circuit is designated by number 47. An unknown analog input signal is applied to the input and connected to a buffer 30. The output of the buffer 30 is connected through resistor 34 to an integrator 36, which includes an amplifier 36a and integration capacitor 36b, and to an auto-zero capacitor 32. The function of the auto-zero capacitor 32 will be described below. The output of the integrator 36 is connected to the positive input of a comparator 38 and to a voltage multiplier 40 which includes an amplifier 40c, resistor 40a and a resistor 40b which has a value eight times the value of the resistor 40a. This value is for a typical embodiment only and is not to be taken in a limiting sense. The comparator 38 used in the present embodiment is a differential amplifier, and its output will be equal to the difference between its inputs (assuming no offset voltage exists) rather than comparing an input to a fixed reference voltage. The output of the voltage multiplier 40 is selectively connected to a sample and hold storage capacitor 42 and to the negative input of the comparator 38. A line 44 from the output of the comparator 38 forms an auto-zero feedback loop and a line 46 from the comparator 38 forms a feedback loop from the input of the integrator 36.

The output of the comparator 38 is also connected to a zero crossing detector 48 which detects the point at which the comparator output crosses zero. The output of the zero crossing detector 48 is connected to a flip-flop 50 which is clocked by a clock 54. The flip-flop 50 will change state on the first clock pulse after zero crossing. The output of the flip-flop is connected to a control logic 52. The control logic 52 includes appropriate logic gates to control counters 56 and a plurality of switches 62–74, the operation of which will be described below. The counters 56 count pulses from the clock 54 and are connected to a register 58. The register 58 is in turn connected to a driver and display unit 60. Also, the comparator output is connected directly into control logic 52 for polarity detection as is well known in the art.

Figure 8:
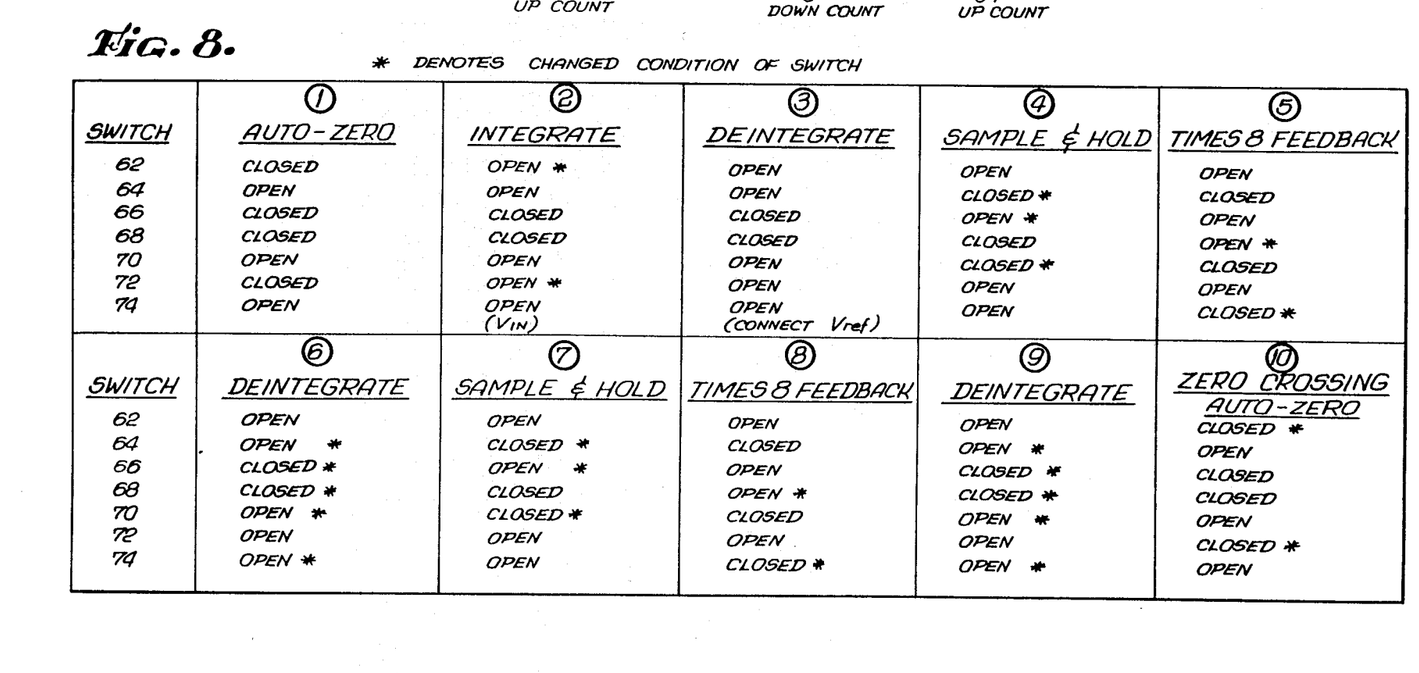
FIG. 8 is a table showing the switching sequence of the circuit of FIG. 7 during each of the phases of FIG. 4.

The operation of the circuit of FIG. 7 follows the sequence shown in FIGS. 4 and 8 and begins with an auto-zero mode. In this mode, switches 62, 66, 68 and 72 are closed and the remainder of the switches are open. All four devices 30, 36a, 38 and 40 are thus active. The output of the comparator 38 will charge the auto-zero capacitor 32 so as to correct for offset voltages of all four devices. The value of the voltage that any terminal in the circuit assumes during the auto-zero mode is the reference or zero voltage that all future measurements at that terminal will be referred to. The auto-zero phase is the same as that used in prior art converters.

During the second phase of a conversion, the switches 62 and 72 are opened and an unknown value analog input signal is applied to the input 80 of the circuit. The input signal is integrated for a predetermined number of clock pulses. The input signal is then replaced with a reference voltage (not shown, but supplied to the input 80 which has a polarity that is opposite that of the unknown input signal and therefore causes the integrator 36 to deintegrate or discharge towards zero at a known rate (phase three). The method of determining the polarity of the unknown input signal is well known and need not be discussed in further detail here. On the first clock pulse after the integrator output crosses its reference zero voltage ($T_1$ in FIG. 4) the comparator 38 output will cross zero and the flip-flop 50 will generate a pulse to the control logic 52. At this point, the integrator output will have gone past its reference zero voltage for a time which is a fraction of one count of the clock 54. Actually, due to delays in the comparator 38 and zero crossing detector 48, the integrator output may have gone past zero for more than a count. However, this will not effect the operation of the system but will simply require greater accuracy in the resistors 40a and 40b (which determine the gain of the voltage multiplier 40) due to the larger amount of overshoot which exists after a greater time period.

When the flip-flop 50 generates its signal to the control logic 52, the control logic 52 immediately stops the deintegration by opening switch 66 and closing switch 64, which isolates the integrator 36 from the input 80 (phase four). At this point, switch 70 is closed and the residual or overshoot voltage of the amplifier 40 will be stored in the storage capacitor 42. The storage capacitor 42 serves a classical sample and hold function. It can be seen that the value which is stored in the storage capacitor 42 is equal to the residual voltage a of the integrator 36 times ($-8$), i.e., $-8a$ volts.

After the residual output of the voltage multiplier 40 has been stored in the capacitor 42, the switch 68 is opened to decouple the output of the voltage multiplier 40 from the storage capacitor 42 (phase five). At the same time, switch 74 is closed and a new feedback loop is established around the comparator 38 and integrator 36. Current is sent into the input of the integrator 36. This causes the output 37 of the integrator 36 to change by charging the capacitor 36b to a voltage which is equal to the voltage stored in the capacitor 42 (minus the offset voltage of the comparator 38). When the inputs to the comparator 38 become equal, the output of the comparator 38 will be zero, and the loop 46 will no longer charge the capacitor 36b. In effect, the integrator 36 has now been charged to $-8a$ volts.

The switch 66 is then closed, switch 64 is opened and the switch 74 opened and the reference voltage connected to the input in order to cause the integrator 36 to deintegrate or discharge once again (phase six). It can thus be seen that after the initial deintegration, the storage capacitor 42 is charged (phase four) and the integrator output 37 is forced to the new value (phase five). In the converter shown in FIG. 7, after the output of the integrator 36 passes zero for the second time, the process will be repeated and a third deintegrate cycle will occur (phases 7, 8 and 9). The count obtained during the third deintegrator cycle will be added to the previous counts in a weighted fashion as described above. A complete diagram of the switching operation is shown in FIG. 8, with asterisks denoting a change in the condition of a switch from one phase to the next.

The description of FIG. 7 to this point has assumed that the offset of the four amplifiers; 30, 36, 40c and 38 is zero. However, a detailed analysis of FIG. 7 will show that the circuit automatically corrects for offsets in all four amplifiers. For instance, during auto-zero, assume that the output of the integrator 36 has a voltage A. The circuit of FIG. 7 will cause the output 37 of the integrator 36 to achieve a value which is 8 times the residual output of the integrator 36 when the feedback loop 46 is closed. During auto-zero, assume that the output of the integrator 36 has a voltage A. Also during auto zero, the negative input of the voltage multiplier 40 will be equal to its offset voltage, which will be called B. The voltage drop across the resistor 40a will be A−B and the current through the resistor 40a will be (A−B)/1. The same current flows through the resistor 40b and its voltage drop is 8(A−B). Therefore, the output of the voltage multiplier 40 is equal to the voltage of its negative input minus the voltage drop of the resistor 40b.

Voltage multiplier 40 output=B−8(A−B). The output of the voltage multiplier 40 is also the negative input of the comparator 38. If the comparator 38 has an offset voltage C, the positive input of the comparator 38 is equal to its negative input plus the offset, which is equal to B−8(A+B)+C. However, the positive input of the comparator is also equal to the output of the integrator 36, $$A = B - 8(A-B) + C$$

The above relationships apply for the auto zero mode. At the end of the first deintegration cycle, the integrator 36 will have overshot its auto zero voltage by a value D. Therefore, Integrator 36 output=A+D therefore, the voltage drop cross the resistor 40a at this point is

A+D−B

Similarly, the voltage drop across the resistor 40b is

8(A+D−B)

The output of the voltage multiplier 40 is thus

B−8(A+D−B)

This is the value that will be stored on the storage capacitor 42.

When the feedback loop 46 is closed (and the switch 68 opened), the output of the integrator 36 will drive only the positive input of the comparator 38. The output of the comparator 38 will drive the integrator 36 to a value that is equal to the comparator offset away from the value that the negative input of the comparator 38 is being held by the storage capacitor 42. This new value for the output 37 of the integrator 36 is

C+[B−8(A+D−B)]

However, it was shown before that $$A = B - 8(A-B) + C$$

By combining the above two equations, the new output 37 of the integrator 36 is shown to be

A−8D

This, of course, is the desired result; during phases four and five the storage capacitor will be charged and the output 37 of the integrator 36 will be forced to a voltage which is 8 times as large as the overshoot voltage and is on the opposite side of the integrator reference voltage A with respect to the overshoot voltage. At this point, the deintegrate process is started again (phase six, with the switches in the same position as in the original deintegrate cycle) and the count is fed into bit 9 of the register 58 and is a down count (i.e., one eighth of the second deintegrate time is subtracted from the first). On the next deintegrate cycle, the count is fed into bit 12 of the register 58 and the count is an up count (i.e., one sixty-fourth of the third deintegration time is added to the first). Thus, at the end of the three deintegrate cycles, a full 12 bit number will be stored in the register 58 and can be displayed by the display 60. It should be noted that, in the system described, the count is injected into the register 58 three bits down, (i.e, three less significant bits) each time the integrator overshoot is multiplied by negative 8 in order to achieve the desired weighting or division. In a decimal system however, the integrator overshoot could be multiplied by −10 and the count then would be injected into the register in the next lower decade.

With the exception of the voltage multiplier 40, storage capacitor 42 and feedback loop 46 and the switches used to control them, the circuit of FIG. 7 is the same as a standard prior art dual slope integrating analog to digital converter. The addition of the above elements along with proper control by the logic 52 results in a converter having the low cost and high accuracy advantages of an integrating converter plus the additional advantage of high speed operation.

In summary, the present invention is directed towards an integrating analog-to-digital converter which achieves both high speed and high accuracy. A complete conversion cycle can be completed in less than 200 counts, as compared with 8,192 typical in prior art 12 bit integrating analog-to-digital converters. With a 2 MHz clock, a conversion can be done every 100 microseconds (i.e., 10,000 readings per second). Thus, as compared to the prior art, a much faster converter is obtained simply by modifying a standard dual slope integrating circuit in a relatively simple manner.

I claim:

1. An integrating analog-to-digital converter comprising:
   an integrator which integrates an unknown analog input signal for a predetermined time period and is subsequently deintegrated at a fixed rate until its output crosses a reference level;
   digital clock means for measuring a first time period from the start of deintegration until the detection of a clock pulse after the output of the integrator crosses the reference level;
   first means for providing a measurement of a second time period between the actual crossing of the reference level and the occurrence of said clock pulse, said first means including means for causing the integrator to assume an output level equal to a predetermined multiple of the residual output of the integrator at the occurrence of said clock pulse and means for again deintegrating the integrator at said fixed rate to obtain the second time period; and
   second means for arithmetically combining the measured first and second time periods and generating a digital output of the combined time periods.

2. An integrating analog-to-digital converter comprising:
   an integrator which is charged to a level established by an analog input signal during an integrate cycle of fixed time and is then deintegrated at a fixed rate for an initial time period until a reference level is crossed, wherein the time to the reference crossing is indicative of the magnitude of the analog input signal;

clock means which provide clock pulses at predetermined intervals for measuring the deintegration time, wherein a time measurement error is introduced because the clock means measures up to the occurrence of at least one clock pulse after actual reference crossing and wherein the pulse width of the clock means is greater than the quantum of time measurement required for the least significant digit of a conversion to be accurate;

correction means for (a) altering the output of the integrator at the end of the measured deintegration time so that it is equal to a predetermined multiple of its residual output at the end of the measured deintegration time and causing the integrator to again be deintegrated at said fixed rate to obtain an error measurement proportional to the time between actual reference crossing and the occurrence of the clock pulse at which the deintegration time measurement is stopped, and (b) subtracting said error measurement from the measured deintegration time to obtain a corrected measurement of the deintegration time; and output means for providing a digital output as a function of said corrected measurement.

* * * * *